United States Patent [19]

Kato et al.

[11] 4,352,205
[45] Sep. 28, 1982

[54] TUNING SYSTEM

[75] Inventors: Masaki Kato; Katsumi Tobita, both of Soma, Japan

[73] Assignee: Alps Electric Company, Ltd., Tokyo, Japan

[21] Appl. No.: 150,296

[22] Filed: May 16, 1980

[30] Foreign Application Priority Data

May 16, 1979 [JP] Japan .................................. 54-60053

[51] Int. Cl.³ ............................ H03J 7/18; H03J 5/24
[52] U.S. Cl. .................................... 455/183; 455/184; 455/185; 455/196
[58] Field of Search ............... 455/183, 182, 184, 185, 455/186, 196, 192, 160, 161, 164, 165, 166, 257, 258, 259, 260; 334/26; 358/191.1, 193.1, 195.1

[56] References Cited

U.S. PATENT DOCUMENTS

| | | | |
|---|---|---|---|
| 4,041,535 | 8/1977 | Rzeszewski | 455/183 |
| 4,081,752 | 3/1978 | Sumi | 455/183 |
| 4,100,578 | 7/1978 | Arneson | 455/182 |
| 4,123,713 | 10/1978 | Wine | 455/186 |
| 4,123,716 | 10/1978 | Borg | 455/192 |
| 4,128,849 | 12/1978 | Rhee | 455/185 |
| 4,142,158 | 2/1979 | Belisomi | 455/196 |
| 4,155,043 | 5/1979 | Sakamoto | 455/185 |
| 4,207,531 | 6/1980 | Ito | 455/184 |
| 4,236,251 | 11/1980 | Ohgishi | 455/183 |
| 4,305,157 | 12/1981 | Mogi | 455/183 |

Primary Examiner—Tommy P. Chin
Attorney, Agent, or Firm—Guy W. Shoup; Gerard F. Dunne

[57] ABSTRACT

A tuning system comprising a memory for storing therein local oscillation frequencies of a plurality of channels to be received and an intermediate frequency, a first control loop circuit for controlling an oscillation frequency of a controlled oscillator on the basis of one local oscillation signal stored in said memory, and a second control loop circuit for controlling a controlled oscillator in such a manner as to render the intermediate frequency of the tuner itself constant on the basis of the intermediate frequency stored in said memory after said first control loop circuit is locked.

11 Claims, 1 Drawing Figure

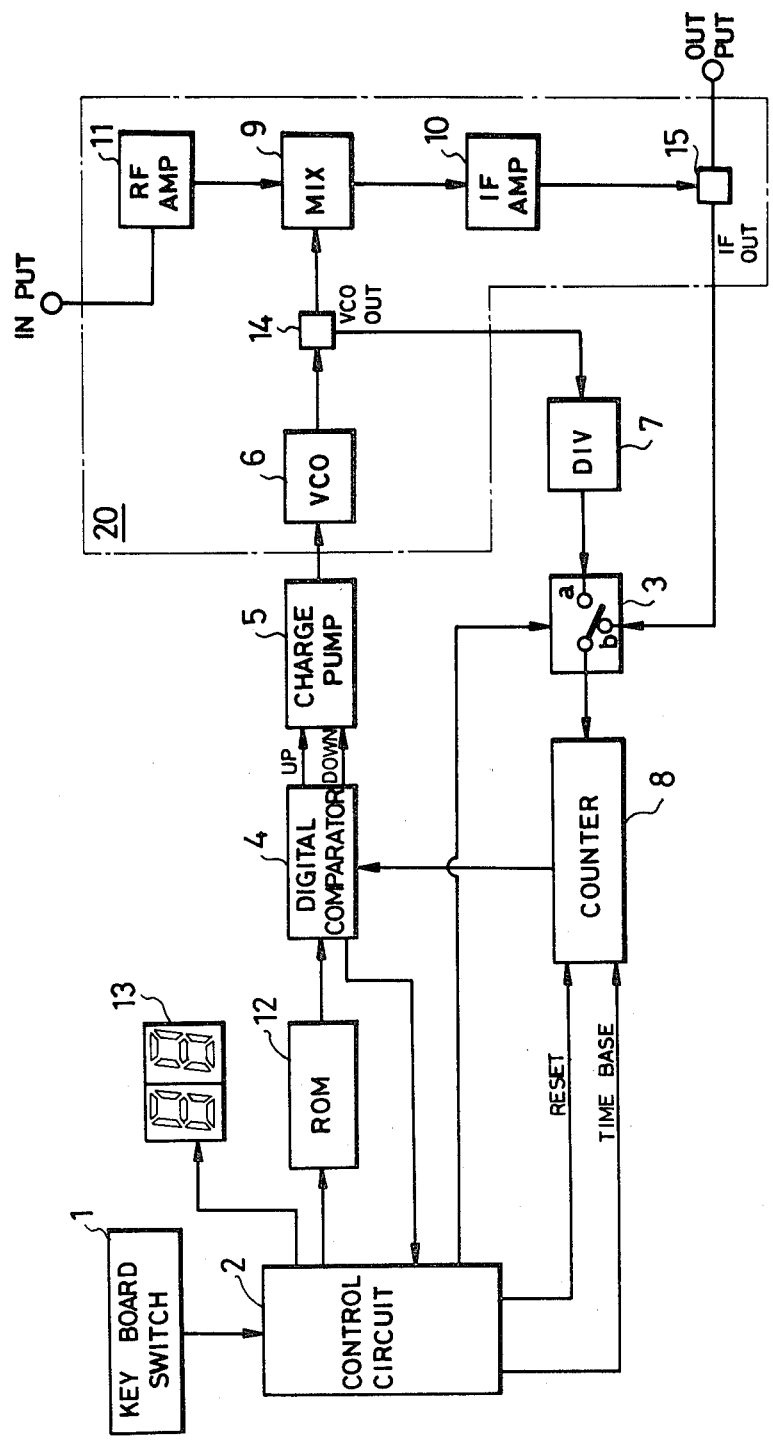

TUNING SYSTEM

BACKGROUND OF THE INVENTION

This invention relates to a tuning system which is suited for a receiver such as a television receiver or RF transceiver.

A conventional tuning system such as disclosed in U.S. Pat. No. 4,142,158 is equipped with a keyboard for selecting a desired channel, a memory for storing a plurality of local oscillation frequencies corresponding to the number of channels and a so-called phase locked loop for maintaining a local oscillation frequency at a predetermined value. When a desired channel is designated by depressing a key on the keyboard, the data for the local oscillation frequency corresponding to the desired channel is read out from the proper memory and a frequency dividing ratio of a programmable divider in the phase locked loop (hereinafter referred to as a "PLL") is determined on the basis of this data. In controlling the oscillation frequency of a voltage controlled oscillator (hereinafter referred to as a "VCO") forming the local oscillator of a tuner, the programmable divider is operable to determine the oscillation frequency. The oscillation frequency from the VCO is applied to the programmable divider where its frequency is reduced, the resulting signal being fed to a frequency comparator. The frequency comparator receives the output from a quartz oscillator as a reference signal and, upon comparing both frequencies with each other, produces such an output signal that renders the oscillation frequency of the VCO constant. The output from this frequency comparator is applied through a lowpass filter to the VCO, from which a predetermined local oscillation frequency correspondng to a desired channel is supplied to the mixer of the tuner. Thus, the channel designated by the keyboard is received.

In the receiving system having the above-described construction, it is desired that the system also be equipped with such a function as will allow a channel to be received by automatically jumping over those channels in which no broadcasting is effected. Depending on a broadcasting area, a station may shift considerably the center frequency of a given channel, even for a channel of the same channel number, in order to prevent interference. In such a case, too, it is desired that the system be capable of being tuned exactly to a selected frequency. When the tuner is of a double super-heterodyne type, further, an automatic frequency control circuit must be added to a second local oscillator so as to cope with the frequency fluctuation of the second local oscillator, if any, even if a first local oscillator is controlled by means of the PLL. Preferably, this problem should also be solved.

SUMMARY OF THE INVENTION

It is an object of the present invention to provide a tuning system which is capable of jumping over empty channels.

It is another object of the present invention to provide a tuning system which is capable of being tuned exactly to a selected frequency even if the center frequency of the selected reception channel is shifted from the general center frequency.

It is still another object of the present invention to provide a tuning system which does not require the addition of an automatic frequency control circuit.

To accomplish these objects, the system of the present invention comprises a first control loop circuit for controlling a local oscillation frequency and a second control loop circuit for maintaining an intermediate frequency of a timer constant, whereby the number of circuits common to both control loop circuits is maximized.

These and other objects and features of the present invention will become apparent from the following detailed description with reference to the accompanying drawing.

BRIEF DESCRIPTION OF THE DRAWING

The accompanying sole drawing is a block diagram illustrating the tuning system in accordance with the present invention.

DETAILED DESCRIPTION OF THE PREFERRED EMBODIMENT

The tuning system shown in the sole drawing consists of a keyboard 1 for designating a desired channel to be received and for switching the channels in the up or down direction, and a control circuit 2 for controlling a control loop circuit to be described later on the basis of the signal from the keyboard. The control loop circuit consists of a first loop circuit and a second loop circuit selected by a switch 3 in response to a signal from the control circuit 2. The first loop circuit comprises a digital comparator 4, a charge pump 5, a voltage controlled oscillator (hereinafter referred to as a "VCO") 6, divider 7 and a counter 8. The second loop circuit comprises the digital comparator 4, the charge pump 5, the VCO 6, a mixer 9, an intermediate frequency amplifier (hereinafter referred to as an "IF amplifier") 10 and the counter 8. A tuner 20 consists of the VCO 6, the mixer 9, the IF amplifier 10 and a radio frequency (hereinafter referred to as an "RF amplifier") 11.

The abovementioned control loop circuit is associated with a READ-ONLY member (hereinafter referred to as "ROM") 12. In the case of a television receiver, for example, the ROM 12 stores in advance signals corresponding to twelve local oscillation frequencies numbered from channel 1 to 12 and a normal intermediate frequency. Reference number 13 in the drawing represents a display for displaying the channel received.

The system of the present invention operates in the following way.

Assume that the receiver is now tuned to the channel-2 and is about to be switched to the channel-5 with the channels-3 and -4 being empty. In this case, the UP key of the keyboard 1 is depressed and the signal from the keyboard 1 is input to the control circuit 2, thereby resetting the counter 8. To actuate the first loop circuit, the switch 3 is manipulated by a signal from the control circuit 2 to change the connection terminal from the contact b to the contact a and the output of the VCO 6, which is the local oscillation signal of the tuner 20, is input to the counter 8. Also, the data of the ROM 12 is changed by one channel in the UP direction. In other words, the control circuit 2 outputs such a control signal that the data of the channel-3 is read out from the memory 12 to the comparator 4. Incidentally, a clock pulse as the time base is sent from the control circuit 2 to the counter 8 in order to set a count time.

The oscillation signal from the VCO 6 of the tuner 20 is allotted by an allotter 14 to the mixer 9 and a frequency divider 7 and the oscillation signal that has been frequency-divided in advance down to a predetermined division ratio is applied to the counter 8 through the switch 3, the counter operating to count the oscillation signal and deliver the counted value to the comparator 4. The binary code of the channel-3 is input to the comparator from the memory 12, which stores the binary code corresponding to the local oscillation frequency of each channel and the binary code corresponding to the normal intermediate frequency, upon an instruction from the control circuit 2, and the comparator 4 compares the counted output from the counter 8 with the binary code from the memory 12. The comparator 4 is adapted such that, for example, when the balance obtained by subtracting the counter output of the counter 8 in the form of a parallel signal from the output data of the memory 12 in the form of a parallel signal is positive (+), it produces an UP signal and when the balance is negative (−), it produces a DOWN signal as its output. The output of the comparator 4 is input to the charge pump 5. The charge pump 5 may be of the same type as, for example, the one normally disposed on the output side of the phase comparator used in conventional PLL. The output signal varies in accordance with the input signal of the charge pump 5 and is applied to the VCO 6 so as to control the oscillation frequency of the VCO 6 and to lock the first loop circuit at such a stage where a desired oscillation is established.

When the oscillation frequency of the VCO 6 attains a frequency capable of receiving the channel-3, the data read out from the memory 12 coincides with the counted output from the counter 8 and the comparator 4 sends a coincidence signal to the control circuit 2. To actuate the second loop circuit, the control circuit 2 then switches over the switch 3 so that an intermediate frequency signal (hereinafter referred to as an "IF signal") is sent from an allotter 15, disposed at the output of the IF amplifier 10, to the counter 8. At the same time, the data read out from the memory 12 is converted from the channel-3 to a binary code corresponding to the normal IF frequency (e.g., 58.75 MHz for channels in Japan).

In the same way as described above, the system is operated so that both coincide with each other. Since the channel-3 is an empty channel devoid of a broadcasting signal, however, due to an IF filter (not shown) of the mixer 9, the mixer 9 does not output any signal from the VCO 6 to the counter 8, and thus the counted value of the counter 8 becomes zero and this counted value 0 is detected by the comparator 4, which in turn delivers a detection signal to the control circuit 2 and changes the read data of the memory 12 to the data of channel-4. At the same time, the switch 2 is also changed over so that the abovementioned operation is repeated to jump over the channel-4 in the same way as the channel-3 until the oscillation frequency of the VCO 6 for the channel-5 attains a predetermined value thereby to detect the coincidence of the IF signal of a subsequent stage.

When the broadcasting frequency coincides with the center frequency of the channel, perfect tuning can be accomplished merely by controlling the output of the VCO 6. Depending upon a broadcasting area, however, it often happens that the broadcasting frequency is considerably shifted from the center frequency of each channel in order to prevent interference. Accordingly, in order to detect the coincidence of the IF signal after the detection of the coincidence of the local oscillation frequency, the data of the IF signal stored in the memory 12 and the counted output of the counter 8 counting the IF signal are compared with each other by the comparator 4 and the VCO 6 is controlled so as to obtain the normal IF frequency, thus to obtain perfect tuning.

Incidentally, when the DOWN key of the keyboard 1 is depressed, the operation is carried out in the same way as above except that the channel number moves to the lower order. When the power source is applied, the system is tuned to the channel of the lowermost order due to the instruction of the control circuit 2. Further, when the counted value of the IF signal is 0, the comparator 4 detects it and transmits the signal to the control circuit 2 in the above-described embodiment. However, it is also possible to detect the counted value by the counter 8 and to transmit the signal to the control circuit 2.

As described above, the system of the present invention selects only a receivable channel by detecting the presence or absence of the IF signal while jumping over the unnecessary channels, even though all channels are stored in the memory. Accordingly, it becomes possible to always receive a different station each time a given key of the keyboard is depressed without receiving the empty channels and without having to actuate the keys for the empty channels before reaching a desired channel.

In switching the reception channel, the system of the present invention drives the oscillation frequency of the VCO into a certain frequency range and changes it into the IF signal to obtain a predetermined IF frequency. During the reception, the coincidence of the IF frequency is constantly detected so that the system of the invention does not call for the addition of an automatic frequency controller. When the tuner is of a double super-heterodyne type, the system so operates as to keep the tuner output constant. Accordingly, even if the oscillation frequency of the second local oscillator fluctuates, the compensation therefor can be made by the first local oscillator (variable oscillator).

Further, control is effected in such a manner as to finally obtain the coincidence of the IF frequency and perfect tuning can be realized in the same channel even if the broadcasting frequency is not the center frequency. Although the frequency control is made over a wide pull-in range, there is no erroneous operation which will pull in adjacent channels.

The system of the present invention makes it possible to compare and control two kinds of signals with one comparator, requires a reduced number of component parts and markedly improves the operability and reliability.

What is claimed is:

1. In a tuning system for selected and tuning a channel signal selected from any one of a plurality of channel signals in the service area of the system; including a variable oscillator responsive to control signals for producing a local oscillation signal; means including a counter receiving signals from said variable oscillator for producing a count signal corresponding to the frequency of said local oscillation signal; means includng a memory for storing signals corresponding to the count signal desired when the variable oscillator is producing the proper local oscillation signal for the channel signal selected; and means including a comparator receiving both said count signals and the signals stored in said memory corresponding to the selected channel signal for producing said control signals for said variable oscillator whereby said variable oscillator will produce the local oscillation signal corresponding to the channel signal selected; and means mixing the local oscillation signal produced by said variable oscillator and a received channel signal for producing an intermediate frequency signal; the improvement wherein said memory additionally storing IF signals corresponding to the intermediate frequency signal, and control means are provided for receiving at least a portion of said intermediate frequency signal and comparing it with said IF signals stored in said memory for producing a second control signal varying said variable oscillator so as to hold said intermediate frequency signal constant, and circuit means for controlling said tuning system so that said control signals produced upon comparing said signals stored in said memory with said count signals are first produced to lock the variable oscillator on the local oscillation signal corresponding to the channel signal selected and then said second control signals are produced to hold said intermediate frequency constant.

2. A tuning system as claim 1, said control means including said comparator and said counter.

3. A tuning system as claim 1, said circuit means further serving to select the appropriate signals from said memory.

4. A tuning system as claim 1, including scan means for selecting from said memory the signals corresponding to an adjacent channel should said control means fail to hold a particular intermediate frequency signal.

5. A tuning system as claim 2, said circuit means including a switch receiving said local oscillation signal and said at least a portion of said intermediate frequency signal and selectively applying one of the signals received thereby to said counter.

6. A tuning system as claim 2, said counter serving to develop a count signal indicative of the frequency of said variable oscillator during locking of said variable oscillator on the local oscillation signal corresponding to the selected channel signal, and serving to develop a count signal indicative of the intermediate frequency signal during operation of said control means.

7. A tuning system as claim 1, said variable oscillator being voltage controlled.

8. A tuning system as either claim 1 or 2, said comparator being a digital comparator.

9. A tuning system as in claim 1, said memory being a read-only memory.

10. A tuning system as in either claim 1 or 2, including a frequency divider dividing the frequency of signals sent to said counter.

11. A tuning system as in either claim 1 or 2, including a charge pump between said comparator and said variable oscillator.

* * * * *